United States Patent [19]

Gay

[11] 4,343,662
[45] Aug. 10, 1982

[54] MANUFACTURING SEMICONDUCTOR WAFER DEVICES BY SIMULTANEOUS SLICING AND ETCHING

[75] Inventor: Charles F. Gay, Tujunga, Calif.

[73] Assignee: Atlantic Richfield Company, Los Angeles, Calif.

[21] Appl. No.: 249,321

[22] Filed: Mar. 31, 1981

[51] Int. Cl.³ .................. H01L 21/22; H01L 21/304; H01L 21/306
[52] U.S. Cl. ..................................... 148/187; 51/323; 156/636; 156/645; 156/662; 156/345
[58] Field of Search .............. 156/636, 645, 662, 345; 51/283, 323; 125/13 R, 16 R; 148/187

[56] References Cited

U.S. PATENT DOCUMENTS

| | | | |
|---|---|---|---|
| 3,128,213 | 4/1964 | Gault et al. | 156/645 |
| 3,738,882 | 6/1973 | Basi | 156/636 |
| 3,869,324 | 3/1975 | Basi et al. | 156/636 |
| 3,915,770 | 10/1975 | Santillo | 156/345 |
| 3,979,239 | 9/1976 | Walsh | 156/636 |

OTHER PUBLICATIONS

Gay, "Chemically . . . Ingots", ARCO Solar Inc., Chatsworth, Ca. (279), pp. 1-15.

Primary Examiner—Jerome W. Massie
Attorney, Agent, or Firm—Nilsson, Robbins, Dalgarn, Berliner, Carson & Wurst

[57] ABSTRACT

A method of forming semiconductor devices incorporates etching during the slicing of a semiconductor ingot from which semiconductor wafers are formed. In addition, a partial slicing through the ingot yields partially cut wafers which are maintained integral beyond a diffusion step. Grinding is then employed to remove unwanted material, to shape, and to accomplish the separation of the wafers. A doped, silicon ingot is used with a solution of sodium hydroxide or potassium hydroxide as the etchant. With the ingot in the [111] type of crystal orientation, the etching proceeds readily adjacent to the slicing cuts to facilitate the slicing, and proceeds slowly elsewhere to minimize material wastage. As a result, the formation of extremely thin wafers with minimal cutting loss is possible.

15 Claims, 6 Drawing Figures

MANUFACTURING SEMICONDUCTOR WAFER DEVICES BY SIMULTANEOUS SLICING AND ETCHING

BACKGROUND OF THE INVENTION

The field of the invention pertains to processes for manufacturing semiconductor devices such as solar cells.

Typical processes for manufacturing semiconductor devices incorporate the slicing of wafers from an ingot of one conductivity type, at some point diffusing a dopant into the wafer to create portions of the opposite conductivity type and also, at some point, etching unwanted material from the wafers.

For example, a typical process employed in the formation of solar cells begins with the growing of a P-type silicon ingot with no particular attention to its type of crystal orientation, or perhaps with a [100] orientation due to the ease of texturing wafers formed from a crystal with this type of orientation. It is, nevertheless, well known that silicon prefers to grow with the [111] type of orientation and can thus be grown faster with this orientation, and some work has been done on employing such ingots. After the ingot is grown, it is typically centerless ground into a cylindrical shape along which a plane surface is then ground for ease of handling of the wafers which will be formed from the ingot.

The shaped ingot is then conventionally mounted, e.g., on an epoxy base, and sawed into wafers of the order of 0.381 mm (0.015") thickness, with a sawdust loss of approximately the same thickness. A rotating saw or cutting wheel having a periphery charged with diamond particles is typically used and must be replaced approximately every 2000 slices.

Since wafers having a thickness of less than one-third the just-mentioned figure can be readily processed into solar cells, the loss of the semiconductor material during sawing is of great significance from an economic standpoint. In addition, sawing speed limitations, to minimize vibration, breakage and cutting damage, tend to make the sawing somewhat of a bottleneck in the over-all manufacturing process. In attempting to improve upon sawing capabilities, work has been done on the development and use of less traditional types of sawing, including diamond wire sawing (wire charged with diamonds), multi-blade slurry sawing (blades without teeth passed through slurry including, e.g., silicon carbide particles) and multi-wire slurry sawing.

Moving to the post-sawing part of the typical process for forming solar cells, the sawed-off wafers are typically retrieved and placed in multi-wafer cassettes. In these cassettes they can readily be subjected to various liquids in order to dissolve the epoxy mounting, to remove the cutting damage (typically 20% by weight sodium hydroxide), to neutralize the damage-removing solution (typically 10% by weight sulfuric acid) and to cleanse the wafers (e.g., purified water). Then, prior to diffusion to form regions of N-type material (e.g., in an open-tube type furnace), the wafers are typically transferred to another quartz cassette, often with double spacing. The double spacing enables wafers to be diffused with a surface of one against a surface of the other, to eliminate or minimize diffusion into the adjacent surfaces.

Following the diffusion, unwanted material is typically etched away, usually by plasma etching, and contacts are applied to the large surfaces of the wafers. Such etching incudes an edge and front surface etching and, in some processes, also a back surface etching.

The repeated individual handling of wafers in the post-sawing part of the process consumes much time and, along with the use of cassettes, results in undesired wafer damage. Further, the removal of material at various stages, either to shape or eliminate material of an undesired type, results in processing which significantly impinges on the efficiency of the over-all manufacturing process.

The present invention provides a foundation for a number of advances over conventional processes for manufacturing semiconductor devices of the type formed from wafers. Such advances include: higher speed sawing; significantly thinner wafers; significantly less sawing loss; minimal handling of individual wafers; the utilization of ingots with a type of crystal orientation that can be most readily grown; and a telescoping of the processing to improve efficiency.

SUMMARY OF THE INVENTION

In accordance with the invention, a method of manufacturing a semiconductor device includes the steps of: providing an ingot of semiconductor material; slicing into the ingot; and etching material from the ingot during the slicing. The etching step may include etching material from the ingot adjacent to a cut formed by the slicing, and may also include contacting the ingot with a liquid etchant, e.g., including a base selected from the group consisting of sodium hydroxide and potassium hydroxide. Also, the input, e.g., of a material comprising silicon, may be in the [111] type of crystal orientation.

In accordance with other aspects of the invention, a method of manufacturing a semiconductor device includes the steps of: providing an ingot of semiconductor material; slicing partially through the ingot at a plurality of locations therealong to form a plurality of cuts in the material; and etching material from the ingot during the slicing.

In accordance with additional features of such latter aspects, the method includes the additional step of grinding material from the ingot following the slicing and etching. In accordance with other additional features, the semiconductor material is of a first conductivity type, and the method includes the additional steps of: diffusing an active impurity of an opposite conductivity imparting type into the ingot to form ingot material of the opposite conductivity type; and removing ingot material of the opposite conductivity type from the ingot, e.g., including the grinding of ingot material of the opposite conductivity type from the ingot.

In accordance with still other features of the latter-mentioned aspects of the invention: the plurality of cuts are substantially parallel; the slicing and etching forms a set of spaced-apart projections from a base for the projections; and the method includes the additional step of removing the base and forming individual pieces from the projections.

DETAILED DESCRIPTION

Figure 1:
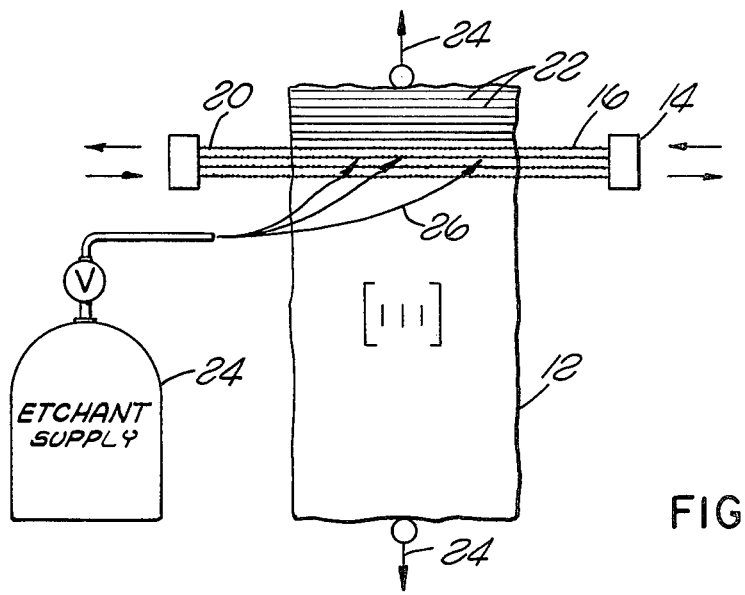
FIG. 1 is a somewhat schematic plan view of an ingot, schematically showing it being sliced and etched.
Figure 3:
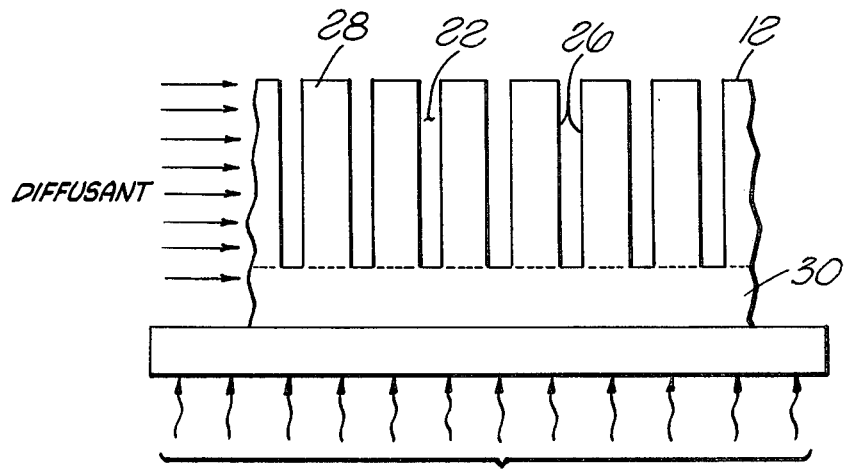
FIG. 3 is an enlarged fragmentary elevational view of the ingot, schematically showing it being diffused with a dopant.

Referring to FIG. 1, an ingot 12 of semiconductor material is shown being sliced by a schematically represented multi-wire reciprocating saw 14 while also being subjected to a liquid etchant in the area of the sawing. As is illustrated in FIG. 3, the slicing is done only part way through the ingot so that the ingot remains integral through and beyond a diffusing step. The separation into individual wafers occurs after a grinding of unwanted material from the ingot (FIGS. 4 and 5), and is in fact accomplished during the grinding of a flat surface along the ingot (also FIG. 5).

Referring to FIG. 1, the ingot is a single crystal ingot having a [111] type of crystal orientation. The ingot is herein assumed to be a silicon ingot of positive type conductivity (P-type), although other semiconductor materials including those of negative type conductivity (N-type) could readily be used in processes similar to that described herein.

The concept of a crystal orientation for an ingot, e.g., of a material with a face-centered-cubic structure such as silicon, is well-understood by those skilled in the art. In accordance with this understanding, planes in the [111] grouping of planes are perpendicular to the longitudinal axis of the ingot; thus, the slicing of such an ingot to form wafers will be along such planes. In addition, the outside surface of the grown ingot generally presents [111] planes, e.g., to an etchant being applied to such surface.

It should be noted that in the sense used herein and in the art, the class of [111] planes is considered not limited by a choice of origin, but encompasses the planes falling in the [111] plane system for a selected origin, and all equivalent planes from a crystallographic standpoint. This of course also applies to the designation of the other classes of planes.

It is noteworthy that silicon ingots naturally grow in the [111] type of orientation by the conventional Czochralski process (in the absence of a seed crystal), and that growing them with a [100] or [110] type of orientation is a slower process and, thus, less economical. However, for ingots used in wafer formation, the [100] type orientation has heretofore usually been considered preferable due to the relative ease with which a surface presenting planes in the [100] grouping may be broken down to provide texturing. On the other hand, a crystal silicon surface presenting planes in the [111] type of grouping is generally not nearly as readily broken down by conventional techniques, which for reasons illustrated by reference to FIG. 1, is advantageous for purposes of the present invention.

In FIG. 1, the mulit-wire saw 14 has a number of cutting wires 16 which are being reciprocated back and forth across the ingot at a number of locations along the ingot, as the wires move into the ingot. At a given position along the ingot, diamond particles 20 along the cutting wires 16 abrade the ingot in order to form cuts 22 into the ingot. The referred to cutting locations might be conveniently viewed, for purposes of the particular form of ingot and cuts herein, as the intersection of the cuts with the outer ingot surface, as evident in FIGS. 1–3. (For clarity of illustration, the cuts 22 of FIG. 1 are shown with greatly enlarged spacing.)

During the cutting into the ingot, the ingot is subjected to a tensile force at either end, illustrated by the arrows 24. This tensile force aids the cutting by creating tension along the ingot which is in part relieved by the cutting. The silicon ingot in fact is most readily cleaved between planes in the [111] system. Thus, the [111] type of orientation facilitates the cutting process.

As the wires reciprocate across and down into the ingot 12, a liquid etchant is passed over the ingot in the area being cut, and into the cuts. This is illustrated by a supply of the etchant 24 and arrows 26 representing the flow of the etchant. A sodium hydroxide or potassium hydroxide solution is conveniently used with the silicon ingot, and for purposes of illustration will be assumed to be the etchant. Increased solution temperatures for the etchant and greater sodium or potassium hydroxide concentrations will generally result in a greater rate of etching. Thus, these variables may be used to "tune" the etching and the interaction between the etching and the sawing.

The etchant performs two interrelated functions. First, it facilitates the cutting. It does this by dissolving the silicon agglomerates that are created during the cutting and that accumulate in the cuts 22 as they are made and also along the cutting wires 16. It also eases the cutting by etching some material from the side surfaces 26 of the ingot adjacent to a cut 22 while the cut is being formed. Although the [111] planes perpendicular to the axis of the ingot are normally not readily etched away by the sodium or potassium hydroxide etchant, the sawing damage therealong and the saw pressure negates this disinclination to be etched. The second of the dual purposes of the etchant has been impliedly referred to. This is the etchant's role in etching material that has been damaged by the sawing from the ingot during such sawing, in particular material from along the side surfaces 26 adjacent to the cuts 22.

As is illustrated by the cuts 22 already made in FIG. 1, the sawing of the ingot proceeds to subsequent positions along the ingot after the cutting illustrated in FIG. 1. This of course requires relative movement between the ingot and saw in conventional fashion along the longitudinal axis of the ingot. As is illustrated by reference to FIG. 3, the sawing is terminated in each case before the cutting wires pass completely through the ingot. The result is an ingot 12 having a large number of substantially parallel cuts 22 between a set of ingot projections 28 from an ingot base 30 for the projections.

From the foregoing, it is evident that the concurrent etching and slicing may be advantageously employed independently of whether the slicing is only partially through the ingot. In addition, it may also be advantageously employed with a variety of types of saws, including slurry saws and the most-often used (single blade) rotating saws or cutting wheels charged with diamond particles. Thus, the invention could readily be illustrated with such a rotating saw or cutting wheel in FIG. 1 rather than the multi-wire saw 14. Since sodium hydroxide and potassium hydroxide generally do not interact with the materials of which semiconductor saws are made or with the silicon carbide particles that are typically used in slurry sawing, they are particularly favorable etching materials for present purposes. With regard to slurry sawing, it will of course be desirable to choose a carrying fluid for the silicon carbide particles that also does not interact with sodium or potassium hydroxide.

The concurrent sawing and etching is also of interest independently of the type of crystal orientation of the ingot. However, the use of an ingot with the more conventional [100] type orientation, presenting surfaces which readily are etched by sodium or potassium hydroxide, may result in significant undesirable etching along the outside of the ingot. In addition, it may result in more etching along the surfaces adjacent to the cuts than is desirable, including an undesirable taper along such surfaces. At the same time, certain advantages which have already been noted will nevertheless be achieved.

The remainder of the process following the sawing and etching is readily understood by reference to FIGS. 2-6.

Figure 2:
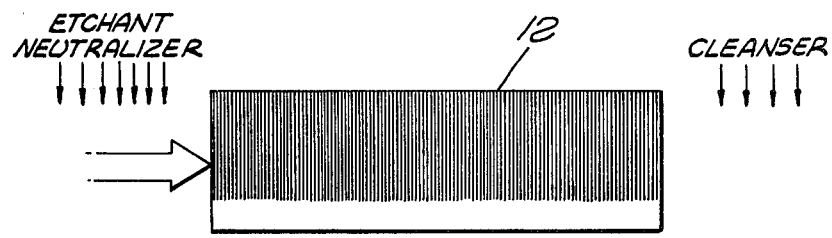
FIG. 2 is a schematic diagram of the neutralizing of the etchant and the cleansing of the ingot following the slicing and etching.

After the sawing and etching has been completed, the ingot 12 is soaked in an etchant neutralizer, e.g., a solution of sulfuric acid, and then soaked in a cleansing liquid, e.g., purified water (FIG. 2). Thereafter, in integral form, it is diffused with an active impurity in order to form N-type conductivity portions of the ingot material as well as what will become the P/N junctions in the wafers (FIG. 3). Such diffusion is according to techniques well understood and often used, and thus, need not be described in detail.

Figure 4:
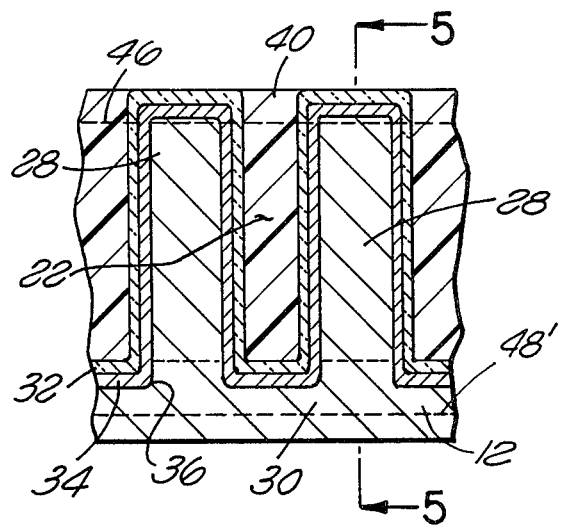
FIG. 4 is an enlarged fragmentary, longitudinal cross-sectional view of the diffused ingot with a potent disposed in the cuts therein.

Summarily, the sliced and etched ingot is subjected to, e.g., phosphorous oxychloride gas at an elevated temperature, e.g., in an open-type type diffusion furnace, to form a phosphorous pentoxide glass outer layer 32 (FIG. 4). From this layer, phosphorous atoms diffuse into formerly P-type material to form an N-type layer of semiconductor material 34 under the glass layer, and a P/N junction 36 (also FIG. 4).

It is particularly noteworthy that the neutralizing, cleansing and diffusing steps permit handling of an integral piece rather than a large number of individual wafers. Further, the thermal characteristics of the integral piece in a diffusion furnace are advantageous to the achievement of uniformity in diffusion and in minimizing imperfections that typically form during the diffusion process.

Following diffusion, the sliced and etched, as well as the now diffused, integral ingot is provided with a potent 40, such as epoxy or paraffin, in the cuts 22 therein (FIG. 4). The purpose of the potent is to provide support during grinding, which is illustrated by FIGS. 4 and 5, and to temporarily hold the individual wafers together when they become separated during grinding.

Figure 5:
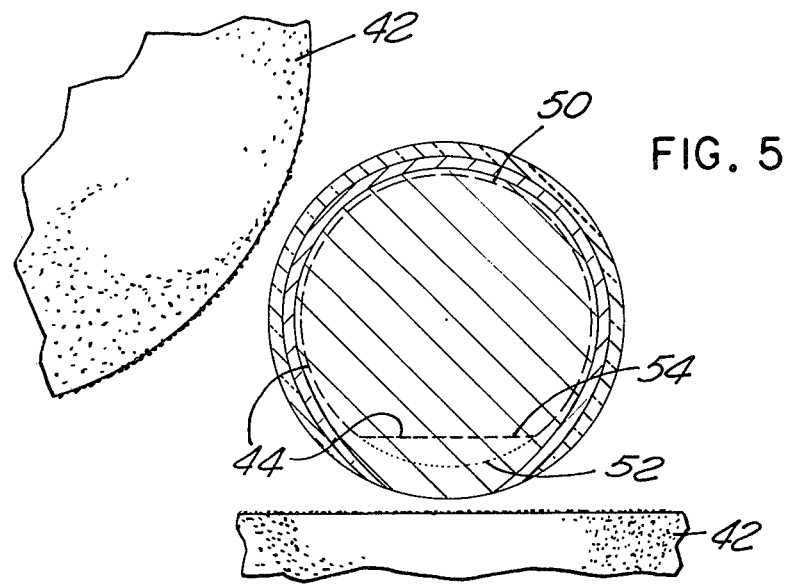
FIG. 5 is a cross-sectional view of the diffused ingot taken along line 5—5 of FIG. 4, schematically illustrating the grinding of the ingot.
Figure 6:
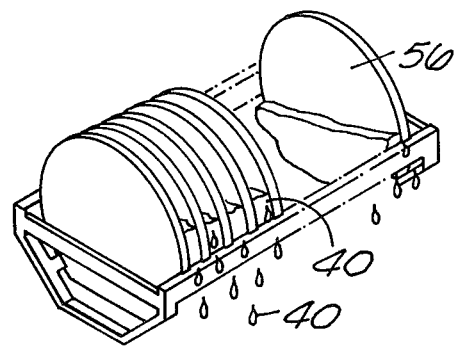
FIG. 6 is a somewhat schematic perspective view of the separated ingot wafers in a cassette, schematically illustrating the removal of the potent from between the separated wafers.

A two-stage grinding is illustrated in FIG. 5, through schematically represented conventional grinding apparatus 42 and a dashed outline 44 of the cross-section of a wafer following such grinding. The dashed line 44 is representative of the circular-shaped outer edge of the individual wafers, broken therealong by flats. This shape, and the elimination of the phosphorous pentoxide glass layer 32, the N-type layer 34 and the junction 36 along the edges of the projections 28, is accomplished by the grinding.

The first stage, a centerless grinding, is illustrated in FIG. 4 by an upper dashed line 46, above which material is ground off, and a lower dashed line 48' below which material is ground off (along the cross-sectional plane of FIG. 4). This is also represented by the circular part 50 of the dashed line 44 together with a dotted line 52 in FIG. 5. The centerless grinding is followed by the complete grinding away of the remainder of the base 30 and of small portions of the projections 28 near the base to form individual wafers with flats along their otherwise circular edges. This second stage is illustrated by the linear part 54 of the dashed line 44 in FIG. 5. As a result of the two-stage grinding, individual wafers have been formed, unwanted material has been eliminated from the edges of the wafers and the wafers have been shaped. The flat of course is desired for subsequent handling.

After these grinding steps are completed, the individual wafers 56 (FIG. 5, wafers shown in less than normal number and with a separation for clarity), held together by the potent 40, are placed in a cassette, e.g. of aluminum, and the potent is dissolved or melted away. For a potent of epoxy, the cassette-wafer assembly can be soaked in an appropriate dissolving solution. For a potent of paraffin, the paraffin can be melted by heat applied to a liquid in which the assembly is soaked. Alternatively, hot air or some other appropriate gaseous environment may be employed. Potent removal is employed in conventional processes and, thus, is well understood.

Following this, the wafers can be further processed according to conventional methods. In the case of the formation of solar cells, this would normally encompass the further removal of the phosphorous pentoxide glass layer from the surface which is to become the front surface, and providing the wafer with front and back contacts. Depending on the material and the form of the back contact, etching of the back surface may or may not be required.

It, of course, will be appreciated that variations and changes may be made in the particular process which has been described without departing from the spirit and scope of the invention.

What is claimed is:

1. A method of manufacturing a semiconductor device, comprising the steps of:
   providing an ingot of semiconductor material;
   mechanically slicing into said ingot; and
   etching material from said ingot in the region of said slicing during said slicing.

2. The method as defined in claim 1 wherein said etching step includes etching material from said ingot adjacent to a cut formed by said slicing.

3. The method as defined in claim 1 wherein said ingot is in the [111] type of crystal orientation.

4. The method as defined in claim 3 wherein said semiconductor material comprises silicon.

5. The method as defined in claim 1 wherein said etching step includes contacting said ingot with a liquid etchant.

6. The method as defined in claim 5 wherein said etchant includes a base selected from the group consisting of sodium hydroxide and potassium hydroxide.

7. The method as defined in claim 6 wherein said ingot is in the [111] type of crystal orientation.

8. A method of manufacturing semiconductor devices, comprising the steps of:
   providing an ingot of semiconductor material;

mechanically slicing partially through said ingot at a plurality of locations therealong to form a plurality of cuts in the material; and etching material from said ingot in the region of said slicing during said slicing.

9. The method as defined in claim 8 wherein said semiconductor material is of a first conductivity type, and including the additional step of:

diffusing an active impurity of an opposite conductivity imparting type into said ingot to form ingot material of the opposite conductivity type.

10. The method as defined in claim 9 including the additional step of removing ingot material of said opposite conductivity type from the outside surface of said ingot.

11. The method as defined in claim 10 wherein the removing step includes grinding ingot material of said opposite conductivity type from said ingot.

12. The method as defined in claim 8 wherein said cuts are substantially parallel and said slicing and etching forms a set of spaced-apart projections from a base for said projections.

13. The method as defined in claim 12 including the additional step of removing said base and forming individual pieces from said projections.

14. The method as defined in claim 13 wherein the removing and forming step includes grinding off the base.

15. The method as defined in claim 8 including the additional step of grinding material from said ingot following said slicing and etching.

* * * * *